United States Patent [19]
Beasom

[11] Patent Number: 4,941,027
[45] Date of Patent: Jul. 10, 1990

[54] HIGH VOLTAGE MOS STRUCTURE
[75] Inventor: James D. Beasom, Melbourne, Fla.
[73] Assignee: Harris Corporation, Melbourne, Fla.
[21] Appl. No.: 302,386
[22] Filed: Feb. 27, 1989

Related U.S. Application Data
[62] Division of Ser. No. 620,834, Jun. 15, 1984, abandoned.

[51] Int. Cl.⁵ .............................................. H01L 11/00
[52] U.S. Cl. ................................ 357/23.12; 357/23.4; 357/20; 357/52; 357/48; 357/53; 307/304
[58] Field of Search .................... 357/23.12, 23.4, 20, 357/52, 48, 53; 307/304

[56] References Cited
U.S. PATENT DOCUMENTS
3,845,495 10/1974 Cauge et al. .......................... 357/49
3,909,320 9/1975 Gauge et al. .......................... 357/23
4,099,998 7/1978 Ferro et al. .......................... 357/13

OTHER PUBLICATIONS
"Threshold Voltage Controllability in Double-Diffused-MOS Transistors", Pocha et al., IEEE Transactions on Electronic Devices; vol ED-21, 1978, pp. 778-784.

Primary Examiner—Andrew J. James
Assistant Examiner—David Soltz
Attorney, Agent, or Firm—Barnes & Thornburg

[57] ABSTRACT

The threshold of a double diffused insulated gate field effect transistor is determined by selectively positioning the source in the decreasing impurity concentration region of the body to set the peak impurity concentration in the channel region for the desired threshold voltage without modification of the process.

17 Claims, 3 Drawing Sheets

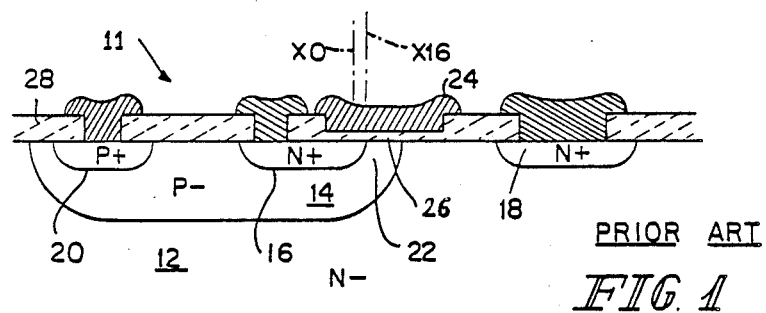
FIG. 1 PRIOR ART
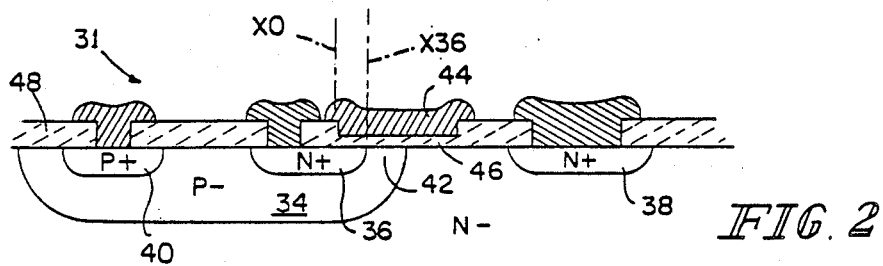
FIG. 2
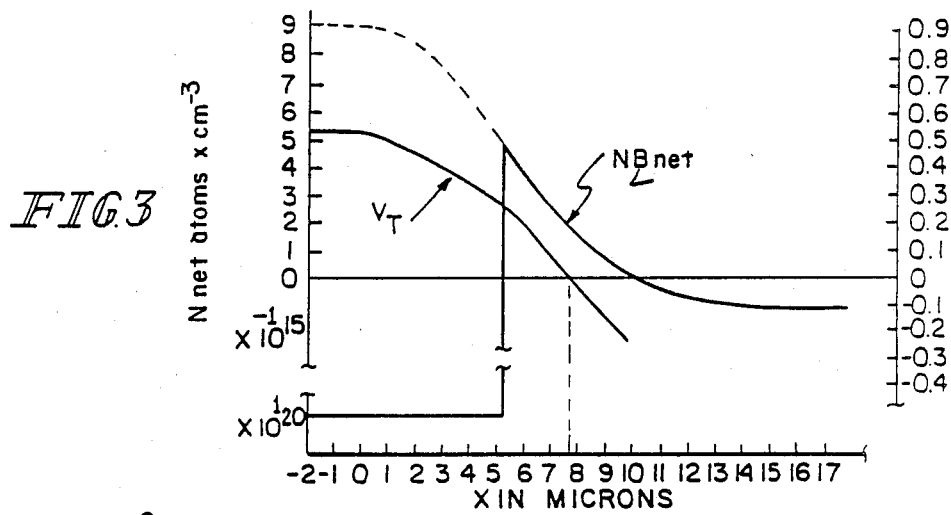
FIG. 3
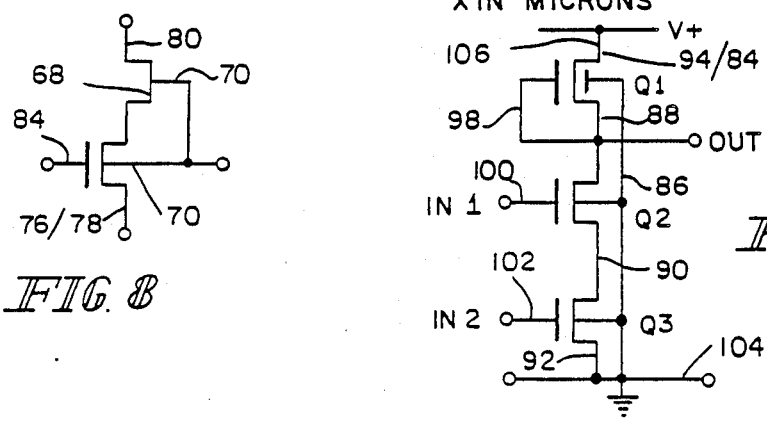
FIG. 8
FIG. 9

HIGH VOLTAGE MOS STRUCTURE

This is a divisional of application Ser. No. 620,834, filed June 15, 1984 now abandoned.

BACKGROUND AND SUMMARY OF THE INVENTION

The present invention relates generally to insulated gate field effect transistors and more specifically to an improved high voltage insulated gate field effect transistor.

Many MOS applications require a device which can operate with a drain voltage much higher (for N channel device) or lower (for P channel device) than the source, body and gate voltages. In a conventional MOS structure, this requires long channels to avoid drain to source punch-through through the lightly doped body. It also requires thick gate oxide where the gate electrode overlaps the drain to avoid gate voltage induced field crowding at the drain body junction which reduces that junction's breakdown voltage. Both of these requirements degrade other characteristics of the device such as transconductance.

A known structure which alleviates these restrictions is the double diffused (DMOS) structure shown in FIG. 1. It uses a lightly doped drain into which body and source diffusions are made. In the conventional structure, the body and source portions adjacent the drain are self-aligned using a common mask edge. Channel length is thus the difference between lateral diffusion of the source and that of the body. Punch-through is avoided by allowing the drain-body depletion layer to spread primarily into the drain which is more lightly doped than the body. The gate overlaps only the lightly doped part of the drain where it acts as a field plate which tends to increase drain-body junction breakdown. Thus, the double diffused structure alleviates the problems of the conventional MOS when high voltage is required.

The double diffused structure has several disadvantages. One is a result of the source-body self alignment. For low threshold voltage $V_T$, the maximum channel surface doping must be low. For high drain-source voltage, the total doping under the source must be high to suppress punch through. However, the doping under the source is essentially the same as the body doping due to the self-alignment of body and source. The result is that channel surface doping can be held low while total body doping is held high only if channel length is made long, thus compromising one of the structure features. Threshold adjustment implants might be used to alleviate the problem, but they add cost and are difficult to control when subjected to the relatively long diffusion cycle of the body which is done after the gate electrode is patterned.

Thus, it is an object of the present invention to provide a high voltage MOS structure which is capable of having low threshold voltages.

Another object of the present invention is to provide a high voltage, low threshold MOS structure without requiring additional processing steps.

Still another object of the present invention is to provide a method of fabricating a high voltage MOS structure with a range of selectable threshold voltages on a single integrated circuit without modifying the process sequence.

A further object of the present invention is to provide a high voltage, low threshold voltage, vertical MOS device.

These and other objects of the invention are attained by selectively forming the source region of a double diffused MOS device in the decreasing impurity portion of a diffused body to set the peak impurity concentration in the channel region of the diffused body to the peak impurity concentration required for specific device threshold voltage. Thus, for a given body and source impurity introduction steps, the threshold of the device can be varied by the mere location of the source region relative to the decreasing impurity concentration of the body region. A high threshold device may also be formed by forming its source region in the substantially constant impurity concentration region of its body region. For a vertical MOS device, the body region is formed as an annulus and the channel region is adjacent the interior of the annulus. A body contact region is adjacent the outer edge of the body annulus and a drain contact is provided either on the bottom of the substrate or at a top surface adjacent the outer edge of the body region. The spacing of the bottom edge of the source region to the bottom edge of the body region is substantially greater than the distance between the side edge of the source region and the inner side of the body region.

Serially connected, merged, insulated gate field effect transistors may be formed wherein one of the field effect transistors has substantially lower threshold voltage than the other and preferably is a depletion device. This includes a common body region having first and second source/drain regions formed therein wherein the first source/drain region is of the lower threshold device and is formed in the decreasing impurity concentration region of the body and the second source/drain region is formed in the constant impurity concentration region. A first gate is formed over the decreasing impurity body region between the first source/drain regions and the substrate, and a second gate region is formed over the body region of constant impurity concentration separating the first and second source/drain regions. Drain contact is made to the substrate adjacent the first gate region. The first gate may be connected to the first source/drain region and the second source/drain region may have a contact connected directly to the body region.

Other objects, advantages and novel features of the present invention will become apparent from the following detailed description of the invention when considered in conjunction with the accompanying drawings.

BRIEF DESCRIPTION OF THE DRAWINGS

FIG. 1 is a cross-section of a high voltage MOS device of the prior art.

FIG. 2 is a cross-section of a high voltage, low threshold insulated gate field effect device incorporating the principles of the present invention.

FIG. 3 is a graphical representation of the impurity concentration for the devices of FIG. 1 and 2 as a function of distance along the surface of the substrate and the threshold voltage is a function of distance along the surface of the substrate.

FIG. 8 is a schematic of the device of FIG. 7.

FIG. 9 is a schematic of a three transistor circuit.

DETAILED DESCRIPTION OF THE DRAWINGS

Figure 4:
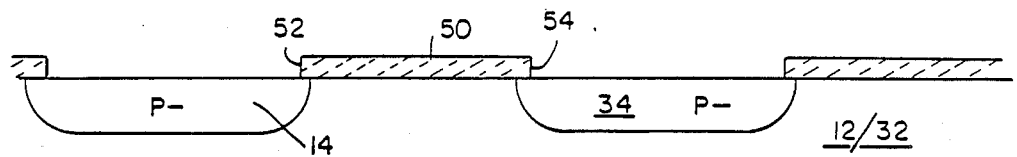
FIGS. 4-6 are cross-sectional views of a wafer including a high and low threshold device according to the principles of the present invention.

A high voltage MOS device 11 of the prior art is illustrated in FIG. 1 as including a P- body region 14 formed in a N- substrate 12. An N+ source region 16 is formed in the P- body region 14 and an N+ drain contact region 18 is formed in the N- substrate 12. A P+ contact region 20 is formed in the P- body region 14. A channel region 22 of the body region 14 extends from the lateral edge of the source 16 to the drain 12. A gate 24 is formed over the channel region 22 and separated therefrom by an isolation layer 26. The surface is also covered by a field dielectric 28. The P- body region 14 is formed by the introduction of impurities by for example, deposition and diffusion form the body region.

The deposition is usually through a mask and includes horizontal as well as vertical diffusion. The N+ source region 16 is also formed by introducing impurities through a mask having an opening smaller than the body mask opening, but having the edge adjacent the channel region 22 in common. This allows the formation of a narrow channel region 23. To vary the channel region, the time, temperature and/or impurity concentration and type may be varied. This results in different size source regions and consequently, the only way to have different size channel regions since the two masks have a common aligned edge.

The top surface region of the body region 14 includes a central area of substantially constant impurity concentration with the lateral edges being of decreasing impurity concentration. The line $X_0$ indicates the effective point of demarcation between the substantially constant impurity concentration region to the left as illustrated in FIG. 1 and a decreasing impurity concentration to the right. The location of the edge of the N+ source region 16 and the channel region 22 will be indicated by the distance $X_{16}$ and, as noted, is slightly in the decreasing impurity concentration region.

As is well known, the threshold voltage of a channel region in an insulated gate field effect device is a function of the peak impurity concentration and is expressed as $$V_T = V_{FB} + \frac{2KT}{q} \ln \frac{N_A}{n_i} + \frac{\left(4 \epsilon_{si} KT N_A \ln \frac{N_A}{n_i}\right)^{\frac{1}{2}}}{C_o}$$

where
$V_{FB}$ = flat band voltage
K = Boltzman's constant
q = electron charge $n_i$ = intrinsic carrier concentration
$\epsilon_{si}$ = dielectric constant of silicon
$C_o$ = gate oxide specific capacitance
$N_A$ = peak body surface doping The peak body concentration for the common case that the body diffusion profile can be approximated by a Gaussian distribution is $$N_A = N_s \exp - \left(\frac{x^2}{4Dt}\right)$$

$N_s$ = body surface doping in the constant impurity concentration part of the body surface
D = diffusion coefficient of body impurity
t = diffusion time of body
x = distance which the source edge adjacent to the channel extends into the decreasing impurity part of the body surface One can relate Dt to the doping of the N- drain region and the body junction depth through the expression $$\frac{1}{4Dt} = \frac{1}{x_j^2} \ln \frac{N_s}{N_c}$$

where
$N_c$ = N- region doping concentration
$x_j$ = body diffusion junction depth
The N+ source concentration does not enter into these expressions.

As can be seen as a first approximation, the peak concentration is a function of the background impurity concentration of the N- substrate 12, the impurity concentration profile of the P- base region 14 and the position of the N+ source region 16. Theoretically, the peak concentration should be at the junction of the N+ source region 16 and the P- base region 14 at the surface of the substrate. But, it is offset from this region into the channel because of the graded rather than abrupt source impurity profile Because of the prior art devices illustrated in FIG. 1 form the N+ source region through a mask having a common edge in the channel region with the diffusion mask of the P- body region 14, the edge $X_{16}$ can only be changed by varying the processing parameters which also effect the body's impurity profile. Thus, the threshold voltage in these type of devices is a function of the impurities used and its diffusion characteristics as well as the diffusion times and temperatures. Since MOS devices are not the only device in the circuit, the impurities, their concentration, and the diffusion time are a function of the other devices formed in the circuit and, therefore there is not much capability of varying parameters without special process steps. The field effect transistors on the same wafer could not have different thresholds without forming the source by separate steps which is undesirable and expensive. Consequently, the prior art, if it wanted to adjust the threshold voltage, would use an ion implantation or other impurity modification step in the channel region 22. As discussed previously, this is an extra step and consequently is undesirable.

A high voltage, selectable threshold insulated gate field effect transistor 31 is illustrated in FIG. 2. The P- body region 34 is formed in an N- substrate region 32. The N+ source region 36 is formed in the body region 34 and an N+ drain contact region 38 is formed in a substrate 34. A P+ body contact region 40 is formed in the body 34. A portion of the body region between the N+ source region 36 and the substrate 32 is the channel region 42. A gate 44 extends over the channel region 42 and is separated therefrom by a thin isolation layer 46. A field dielectric 48 covers the remainder of the device area. As in the previous figure, the point of demarcation of the constant and the decreasing impurity concentration regions of the body region 34 is illustrated by the line $X_0$. The junction of the edge of the N+ source region 36 and the channel region 42 is illustrated by the line $X_{36}$. It should be noted that the line $X_{36}$ is substantially to the right of $X_0$ in FIG. 2 and lies within the region of decreasing impurity concentration. By the selection of the lateral position of the edge $X_{36}$ of the source region 36 in the region of decreasing impurity concentration of the body region 34, the peak concentration of the channel region 42 is set and consequently the threshold voltage is also determined for a given set of region parameters.

The general expression for the body doping along the surface in a structure such as that of FIG. 2 is obtained by summing the position dependent concentrations of the source and body with the substantially constant substrate impurity concentration to obtain the net impurity concentration.

Letting:
x be the distance measured along the surface
$N_D$ be the substrate doping
$N_B(x)$ be the body impurity concentration
$N_S(x)$ be the source impurity concentration
then the net body concentration is $$N_{Bnet}=N_B(x)-N_S(x)-N_D$$

For the structure of FIG. 2, x increasing is to the right. $N_B$ net is zero at two values of x which are $x_{36}$, the source body junction and a greater x where the body drain junction is located.

It is worth noting that for the case that body and source regions are formed by diffusion, $N_B(x)$ is constant for x less than the location of the body diffusion mask and monotonic decreasing for x greater than that value. Likewise, $N_S(x)$ is constant for x less than the location of the source diffusion mask edge and monotonic decreasing for x greater than that value.

FIG. 3 shows a plot of $N_B$ net (x) for the case of body diffusion of 10 microns lateral junction depth and $1 \times 10^{16}$ atoms/cm$^3$ surface impurity concentration in a substrate with impurity concentration of $1 \times 10^{15}$ and with a step junction source which extends 5 microns laterally beyond the body diffusion edge. A dotted line shows $N_B$ net in the absence of the source diffusion. X=0 is taken 2 microns to the left of the body diffusion edge. The body profile is assumed to be Gaussian.

Threshold voltage is plotted on the right vertical axis as a function of the location, x, of the source body junction in the body region. One can see that for the assumed source edge locations, $V_T=0.27V$ compared to $V_t=0.52V$ when the source edge is in the uniform concentration part of the body. The device is depletion mode for x greater than 7.4 microns.

Figure 5:
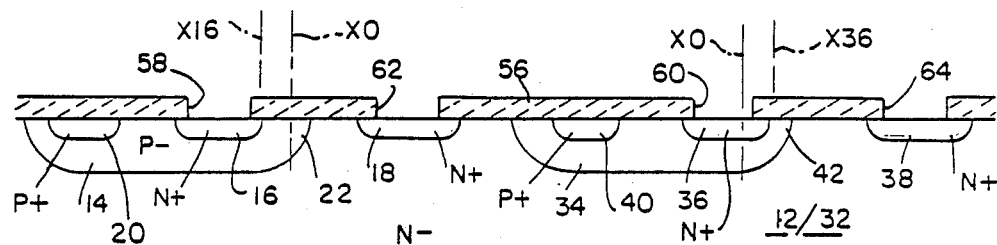
Figure 6:
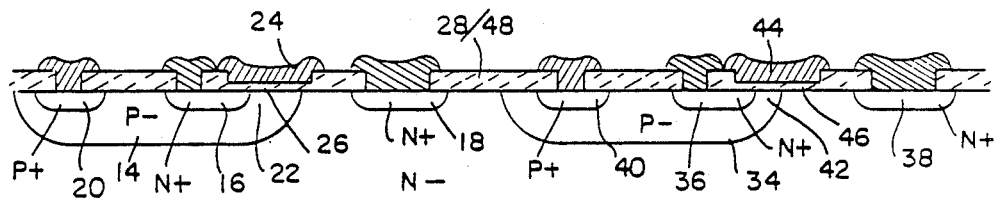

The sequence of operation to form an integrated circuit having high and low thresholds will be illustrated in reference to FIGS. 4–6. It will be noted that for the same processing steps, a high threshold and low threshold insulated gate field effect transistor can be formed by mere selection of the location of the source region relative to the decreasing impurity concentration portion of the channel. The process begins by forming a mask 50 on the surface of an N− substrate 12/32 with openings 52 and 54 therein. P type impurities for example, boron are introduced by deposition and diffusion to form the P− body regions 14 and 34. A typical example is a body region having a depth of 10 microns and a surface concentration of constant impurity of $1 \times 10^{16}$ atoms per cubic centimeter. The structure at this point is illustrated in FIG. 4.

Next, a second masking layer is applied and openings are provided for the body contacts. P type impurities are introduced to form P+ body contact regions 20 and 40 in body regions 14 and 34 respectively. Next, a third masking layer 56 is applied and openings 58 and 60 are provided therein above the source regions and openings 62 and 64 to define the drain contact regions. N type impurities for example, phosphorus are introduced to form N+ source regions 16 and 36 in body regions 14 and 34 respectively and drain contact regions 18 and 38 in the substrate 12/32. It should be noted that the mask layer 56 may be a separate and distinct mask layer from that of 50 or it may be a modification of the original mask layer 50 by reducing the openings 52 and 54 and provide a new opening 62 and 64.

As is evident from FIG. 5, the point $X_{16}$ where the N+ source region 16 lies in the channel region 22 of the body region 14 is to the left or in the substantially constant impurity concentration region of the surface of the body region 14. In contrast, the point $X_{36}$ of the N+ source region 36 lies to the right or in the portion of the channel region 42 of diminishing impurity concentration. Since the N+ source 16 and 36 have been formed during the same processing step, they have the same depth and impurity concentration and, thus, the difference of the threshold voltage is a function of the openings 58 and 60 in the mask layer and relative to the point $X_0$. Although the same reference number for the high threshold device has been used in FIGS. 1 and 4–6, the device of FIGS. 4–16 has a higher threshold than that of FIG. 1 since source 16 is formed only in the constant impurity concentration region.

The process is completed by forming thin oxide layers 26 and 46 over the channel regions 22 and 42 and field insulative layer 28, 48. Gates 24 and 44 are formed over the thin oxide layers 26 and 46. Openings are provided in the field insulative layer 28, 48 and metal contacts are provided to body contact regions 20 and 40, source regions 16 and 36 and drain contact regions 18 and 38.

It should be noted that the gate 24 may be different material than the contact regions or may be of the same material and formed during the same step. As discussed in the Background of the Invention, the gate regions 24 and 44 extend over the channel region 22 and 42 as well as over the lightly doped substrate or body regions 12/32. This provides the high voltage capability in combination with low doping impurity concentration of the body regions 14 and 36.

Figure 7:
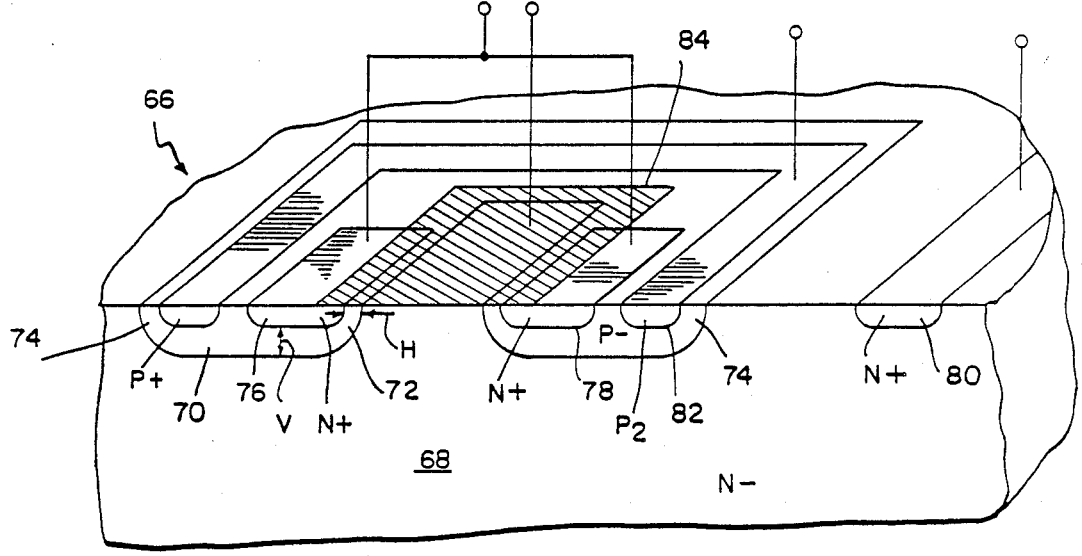
FIG. 7 is a cross-sectional perspective of a vertical high voltage, low threshold device according to the principles of the present invention.

Although the discussion so far has been to horizontal or lateral double diffused insulated gate field effect transistors, the same principle is applicable to vertical, double diffused, insulated gate field effect transistors. Such an embodiment is illustrated in FIG. 7. A P− annulus body 70 is provided in the substrate 68 having an inner lateral edge 72 and an outer lateral edge 74. N+ source regions 76 and 78 are formed in the decreasing impurity concentration region adjacent the inner lateral edge 72 of the body 70. An N+ drain contact 80 is formed in the substrate 68 adjacent the outer edge 74 of the annulus 70. A P+ body contact 82 is formed as a ring in the annulus 70 adjacent the outer edge 74. The gate structure 84 is formed over the body portion 70 between the sources 76/78 and the interior of the annulus 72.

The horozontal dimension or separation of the lateral edge of the source region 76 and the adjacent lateral edge 72 of the body region 70 is substantially smaller than the vertical distance between the bottom of the N+ source region 76 and the bottom of the body region 70. Thus, the net body charge in the surface region H between the source and drain is less than the body charge beneath the source. The significance of this feature is that the low body charge in the surface between the source and drain allows a shorter channel length and low threshold voltage, both desirable features. High body charge beneath the source increases punch-through voltage allowing higher breakdown voltage and reduce snapback breakdown susceptibility by increasing the Gummel number of the parasitic vertical NPN transistor thereby reducing its current gain. The low charge at the surface is shielded from high voltage by the gate field plate in the lateral MOS geometry and by a junction field effect transistor which is the inherent part of the structure in the vertical insulated gate field effect transistor device.

In the vertical DMOS structure, current flows from the source through the channel to a region of the drain at the wafer surface which is surrounded by the body. It then flows perpendicular to the wafer surface vertically into the region of the drain beneath the body and to the drain contact 80. An advantage of the structure of FIG. 7 is that a vertical NJFET is formed in series with the MOS source. This is illustrated in the schematic of FIG. 8. P body 70 forms the gate of the junction field effect device and the substrate 68 forms the drain and channel region. The JFET can be pinched-off at modest voltage set by the geometry of the opening in the body. Thus, the interior at 72 of the region 70 which forms the gate of the JFET will pinch-off interrupting the flow from the drain part of the MOS device to the drain contact 80 exterior the annulus 70. At drain voltages higher than the JFET pinch-off the gate oxide and the source-body junction at the surface of the wafer in the annulus are shielded from drain voltage allowing greater process design flexibility to higher voltages.

It should be noted that although the horizontal and vertical separation of the source 76 from the drain 68 is highlighted for the structure of FIG. 7, it is also applicable to the structure of FIG. 2 and FIG. 6. The desired objective of high vertical charge with low lateral charge is achieved by using sources appreciably shallower than the body and offsetting them into the side diffused part of the body to reduce the surface charge. The choice of the shallow source regions leaves much of the vertical body beneath the source and thereby maximizing the body charge thereunder.

Figure 10:
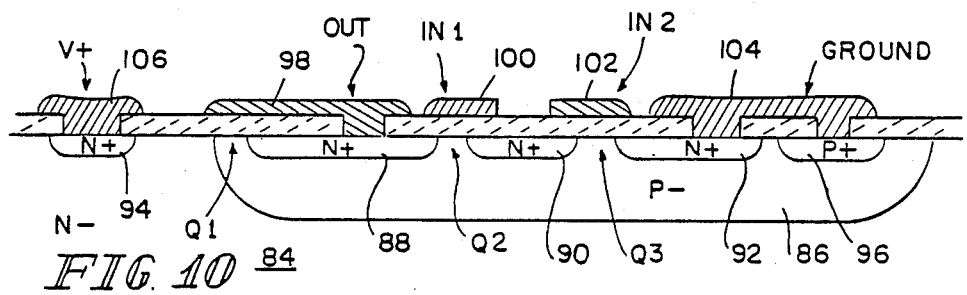
FIG. 10 is a cross-sectional view of an integrated circuit implementing the schematic of FIG. 8 and incorporating the principles of the present invention.

Further application of the principles of the present invention is illustrated in the schematic of FIG. 9 and the cross-section of FIG. 10. A first insulated gate field effect transistor Q1 is connected as a depletion load with its gate connected to its source. The source-drain of Q1 is connected in series with the source-drain of Q2 which is in series with the source-drain path of Q3. The three series connected transistor circuit is connected between ground and the supply voltage V+. The input to the circuit is on the gate of Q2 and Q3 and the output is between the connection of the source and drain of Q1 and Q2.

The structure as illustrated in FIG. 10 includes a P— body region 86 formed in an N— substrate 84. Three N+ source/drain regions 88, 90 and 92 are formed in N+ body region 86. An N+ drain contact 94 is formed in the substrate region 84 and a P+ body contact 96 is formed in the body region 86. While the N+ regions 90 and 92 are formed in the substantially constant impurity concentration region of the body region 86, the N+ region 88 is formed having a portion extending into the diminishing impurity concentration region of the P— body 86. A gate 98 is formed over the diminishing impurity concentration region to form the first transistor Q1. A second gate 100 is formed over the substantially constant impurity concentration region of body 86 extending between N+ regions 88 and 90 to form the gate of the second transistor Q2. A third gate 102 of transistor Q3 extends over the substantially constant impurity concentation region of body 86 between N+ regions 90 and 92.

An interconnect 104 connects the N+ source region 92 for transistor Q3 to the body contact region 96. The gate 98 of the transistor Q1 is connected directly to the N+ source region 88 of transistor Q1 which is also the drain of transistor Q2.

It should be noted that the transistor Q1 is a depletion mode N channel device and is a very useful high voltage circuit design element functioning as a two terminal current source. It provides a one component source of low current which can operate to high voltages which is often desirable substitute for large value high voltage resistors which consume more die area. Requirements for depletion mode operation can be understood by examination of the threshold voltage expression given earlier. In that expression $V_{FB}$ is negative for an N channel device in silicon with usual processing while the other two terms, both of which increase with body doping $N_A$, are positive. $V_{FB}$ is independent of body doping. One must reduce body doping to the point that the sum of the body doping dependent terms is smaller than $V_{FB}$ to achieve a depletion mode device which is simply an N channel device with a negative threshold. The relationship is further illustrated in FIG. 3.

In silicon P channel devices $V_{FB}$ remains negative for normal processing and structures and the body doping dependent terms are also negative. Depletion mode operation for a P channel corresponds to a positive threshold so depletion mode P channel devices are normally achieved by counter doping the body surface with P type impurities to change the surface of the body P type thus changing the sign of the impurity dependent terms in the threshold expression.

In an overall integrated circuit, the base of a high voltage NPN may be used to form the body and the NPN emitter step to form source and drain contacts. The gate could be the interconnect layer and no thin oxide step would be required. In such a process the structure is not only in small area, but also has the advantage of not requiring extra steps as do prior art structures.

Figure 11:
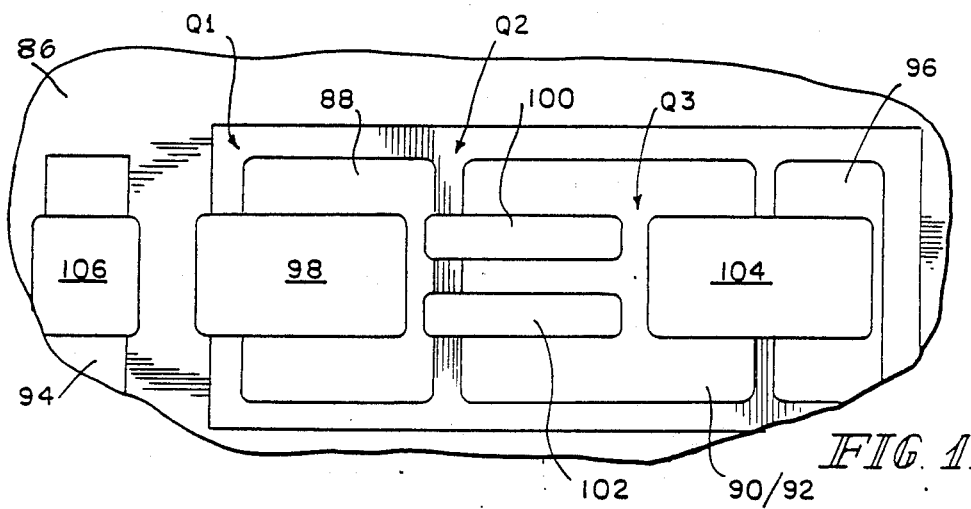
FIG. 11 is a topological view of another three transistor logic circuit.
Figure 12:
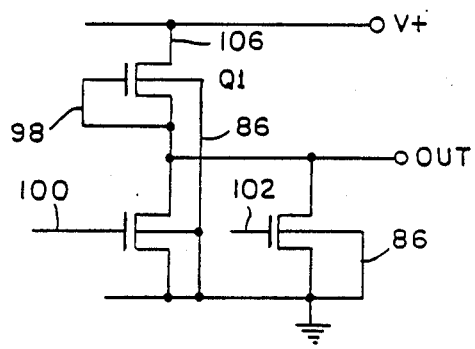
FIG. 12 is a schematic of the circuit of FIG. 11.

The circuit of FIGS. 9 and 10 is but one application. The most general case is forming a depletion transistor $Q_1$ with drain region 94 in the substrate and source region 88 in the decreasing impurity concentration portion of the body 86 and at least one transistor $Q_2$ having drain and source regions 88 and 90 in the same body 86. Additional transistors could be formed in the body 86 and connected to the depletion load transistor $Q_1$ and transistor $Q_2$ to achieve any desired logic function. For example, FIG. 11 illustrates the topograph of parallel connected transistors $Q_2$ and $Q_3$ for the schematic of FIG. 12. The transistors $Q_2$ and $Q_3$ have a single source region 90/92 and a common drain region 88 which is the source for transistor $Q_1$. Another alternative is to enlarge the body 86 and form separate source and drain regions interconnected by surface interconnects instead of merged regions.

Figure 13:
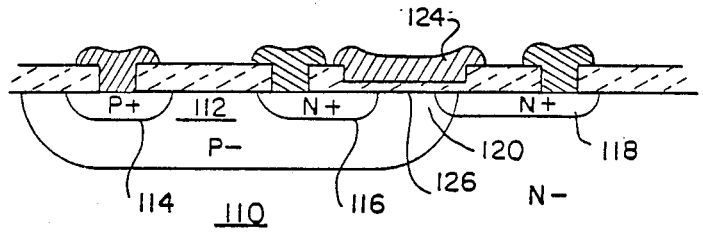
FIG. 13 is a cross-sectional view of a high voltage, high threshold insulated gate field effect device incorporating the principles of the present invention.

A high voltage, high threshold transistor may also be formed by positioning the drain region in the decreasing impurity concentration region of the body and the source in the constant impurity concentration region. As illustrated in FIG. 13, a P− body 112 is formed in substrate/drain 110. A P+ body contact region 114 is formed in body region 112. N+ source region 116 is formed in the constant impurity concentration region of the body 112 and the drain contact region 118 is formed extending from the drain 110 into the decreasing impurity concentration region of the body 112. The gate 124 is separated from the channel region 120 by a thin oxide region 126 and extends over portions of the source 116 and drain contact 118. The threshold voltage may be precisely determined since the peak channel region concentration is in the constant peak body concentration region and any variation in the position of the drain contact region 118 will have minimal effect on the effective channel length since it is formed in the decreasing impurity concentration portion of the body region 112.

It should be noted that the drain contact has been illustrated as a top surface contact. If desired, the contact to the substrate which forms a drain in any of the figures may be through a bottom contact or epitaxial layer.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. An integrated circuit comprising:
   a first insulated gate field effect transistor having a first threshold voltage including a first body region of a first conductivity type in a substrate of a second conductivity type, said substrate forming a first drain region, said body having a constant impurity concentration region and a decreasing impurity concentration region, a first source region of said second conductivity type in said constant impurity region of said first body region and separated from said first drain by said decreasing impurity region, which forms a first channel region, and a first gate over said first channel region and separated therefrom by an insulative layer; and
   a second insulated gate field effect transistor having a second threshold voltage lower than said first threshold voltage including a second body region of said first conducting type in said substrate, said substrate forming a second drain region, said body having a constant impurity concentration region and a decreasing impurity concentration region, and second source region of said second conductivity type in said decreasing impurity region and separated from said second drain by said decreasing impurity region which forms a second channel region and a second gate over said second channel region and separated therefrom by an insulative layer, said second threshold being set by the location of the edge of said second source region in said decreasing impurity region.

2. An integrated circuit according to claim 1 wherein said first and second body regions have the same depth and impurity concentration and said first and second source regions have the same depth and impurity concentration.

3. An integrated circuit according to claim 1 wherein the distance of separation of the bottom of said second source region to said second drain region is substantially greater than the distance of separation of the side of said second source region in said decreasing impurity region to said second drain region.

4. An integrated circuit according to claim 1 including first and second drain contact regions of said second conductivity type in said first and second drain regions respectively and first and second body contact regions of said first conductivity type in said first and second body regions respectively.

5. An integrated circuit according to claim 4 wherein said first drain contact region extends from said drain into said decreasing impurity region of said first body.

6. An integrated circuit comprising:
   a first insulated gate field effect transistor having a first threshold voltage including a first body region of a first conductivity type in a substrate of a second conductivity type, said substrate forming a first drain region, said body having a constant impurity concentration region and a decreasing impurity concentration region, a first source region of said second conductivity type in said decreasing impurity region of said first body region and separated from said first drain by said decreasing impurity region, which forms a first channel region, and a first gate over said first channel region and separated therefrom by an insulative layer;
   a second insulated gate field effect transistor having a second threshold voltage lower than said first threshold voltage including a second body region of said first conducting type in said substrate, said substrate forming a second drain region, said body having a constant impurity concentration region and a decreasing impurity concentration region, and second source region of said second conductivity type in said decreasing impurity region and separated from said second drain by said decreasing impurity region which forms a second channel region and a second gate over said second channel region and separated therefrom by an insulative layer; and
   said first and second thresholds being set by the location of the lateral edge of said first and second source regions in said decreasing impurity region of said first and second body regions respectively.

7. An integrated circuit according to claim 6 wherein said first and second body regions have the same depth and impurity concentration and said first and second source regions have the same depth and impurity concentration.

8. An integrated circuit according to claim 6 wherein the distance of separation of the bottom of said first and second source regions to said first and second drain regions respectively are substantially greater than the distance of separation of the side of said first and second source regions in said decreasing impurity region to said first and second drain regions.

9. An integrated circuit according to claim 6 including first and second drain contact regions of said second conductivity type in said first and second drain regions respectively and first and second body contact regions of said first conductivity type in said first and second body regions respectively.

10. An insulative gate field effect transistor according to claim 6 wherein at least one of said body regions is an annulus having an inner and outer decreasing impurity concentration regions and its source is in said inner decreasing impurity region.

11. An insulative gate field effect transistor according to claim 10 including a drain contact in said substrate adjacent said outer region of said annulus body region and a body contact in said annulus adjacent said outer region.

12. An integrated circuit including at least two serial connected insulated gate field effect transistors comprising:
- a body region of a first conductivity type in a substrate of a second conductivity type, said body having a surface region of substantially constant impurity concentration and a region of decreasing impurity concentration, said substrate forming a drain region of a first transistor;
- first, and second regions of said second conductivity type spaced in said surface of said body region, said second regions being in said constant impurity region and forming a source region of a second transistor, and said first region being in said decreasing impurity region;
- a first gate of said first transistor over said decreasing impurity region between said first region and said substrate and separated therefrom by an insulative layer, a second gate of said second transistor over said constant impurity region between said first and second regions and separated therefrom by an insulative layer;
- a drain contact connected to said substrate and a body contact connected to said body and second regions; and
- said first transistor having a lower threshold voltage than said second transistor.

13. An integrated circuit according to claim 12 wherein said drain contact includes a drain contact region of said second conductivity type in said substrate adjacent said first region.

14. An integrated circuit according to claim 12 including a first region contact and said first gate is connected to said first region contact, and a body contact and said second region contact is connected to said body contact.

15. An integrated circuit according to claim 12 wherein the impurity concentration in said decreasing impurity region is sufficiently low that said first transistor has a negative threshold voltage.

16. An integrated circuit according to claim 12 including a third transistor connected in series with said first and second transistor and having a third region of said second conductivity type in said constant impurity region of body region between and spaced from said first and second regions, said second gate is over said body region between said second and third regions, and a third gate of said third transistor over said body region between said first and third regions and separated therefrom by an insulative layer.

17. An integrated circuit according to claim 12 including a third transistor connected in parallel with said second transistor and having a third region of said second conductivity type in said constant impurity region of said body region forming a source region of said third transistor spaced from said first and second regions, a third gate of said third transistor is over said body region between said first and third regions and separated therefrom by an insulative layer, and said body contact is connected to said third region.

* * * * *